United States Patent
Lee et al.

(10) Patent No.: US 7,506,234 B2
(45) Date of Patent: Mar. 17, 2009

(54) SIGNATURE CIRCUIT, SEMICONDUCTOR DEVICE HAVING THE SAME AND METHOD OF READING SIGNATURE INFORMATION

(75) Inventors: Yu-Lim Lee, Busan (KR); Sung-Hoon Kim, Seongnam-si (KR)

(73) Assignee: Samsung Electronics Co., Ltd (KR)

( * ) Notice: Subject to any disclaimer, the term of this patent is extended or adjusted under 35 U.S.C. 154(b) by 369 days.

(21) Appl. No.: 11/472,850

(22) Filed: Jun. 22, 2006

(65) Prior Publication Data
US 2007/0030051 A1    Feb. 8, 2007

(30) Foreign Application Priority Data
Jul. 19, 2005   (KR) ............... 10-2005-0065384

(51) Int. Cl.
*G01R 31/28* (2006.01)
(52) U.S. Cl. ............ 714/732; 714/30; 714/45; 714/716; 714/734; 714/718; 326/26; 326/30; 327/525; 365/225.7; 365/226
(58) Field of Classification Search ............ None
See application file for complete search history.

(56) References Cited

U.S. PATENT DOCUMENTS

| | | | | |
|---|---|---|---|---|
| 4,806,793 | A | 2/1989 | Golab | 307/443 |
| 6,489,832 | B1 * | 12/2002 | Kim et al. | 327/525 |
| 6,842,035 | B2 * | 1/2005 | Kurts et al. | 326/30 |
| 6,940,776 | B2 * | 9/2005 | Cho | 365/225.7 |
| 7,036,055 | B2 * | 4/2006 | Muljono et al. | 714/716 |
| 7,138,823 | B2 * | 11/2006 | Janzen et al. | 326/30 |
| 7,227,377 | B2 * | 6/2007 | Kurts et al. | 326/30 |
| 7,285,979 | B2 * | 10/2007 | Janzen et al. | 326/30 |
| 7,317,328 | B2 * | 1/2008 | Kim | 326/30 |
| 7,342,412 | B2 * | 3/2008 | Kim | 326/30 |
| 7,372,294 | B2 * | 5/2008 | Kim | 326/30 |
| 2004/0128601 | A1 * | 7/2004 | Muljono et al. | 714/734 |
| 2004/0183565 | A1 * | 9/2004 | Viehmann et al. | 326/30 |
| 2005/0117433 | A1 * | 6/2005 | Fujisawa | 365/226 |
| 2005/0225353 | A1 * | 10/2005 | Kwon | 326/30 |
| 2005/0283671 | A1 * | 12/2005 | Stave | 714/31 |
| 2006/0253738 | A1 * | 11/2006 | Stave | 714/31 |

FOREIGN PATENT DOCUMENTS

KR   10-2004-0069824   *   6/2004
KR   10-2004-0068720   *   8/2004

* cited by examiner

*Primary Examiner*—John P Trimmings
(74) *Attorney, Agent, or Firm*—Mills & Onello LLP

(57) ABSTRACT

A signature circuit in a semiconductor chip includes a signature program circuit configured to be programmed with signature information and to output a signature signal in response to the signature information; a signature output circuit configured to block the signature signal output by the signature program circuit during operation in a normal mode, and configured to pass the signature signal during operation in a test mode; and a pad-driving transistor directly coupled to the pad, configured to drive the pad during operation in the normal mode in response to an operation command, and configured to drive the pad during operation in the test mode in response to the signature signal output by the signature output circuit. The signature circuit outputs the signature information through a transistor for adjusting impedance to reduce a chip size by omitting an additional logic circuit for the signature circuit.

16 Claims, 6 Drawing Sheets

SIGNATURE CIRCUIT, SEMICONDUCTOR DEVICE HAVING THE SAME AND METHOD OF READING SIGNATURE INFORMATION

CROSS-REFERENCE TO RELATED APPLICATIONS

This application claims priority to Korean Patent Application No. 10-2005-0065384 filed on Jul. 19, 2005 in the Korean Intellectual Property Office (KIPO), the entire contents of which are herein incorporated by reference.

BACKGROUND OF THE INVENTION

1. Field of the Invention

The present invention relates to a signature circuit and a method of reading signature information, and more particularly to a signature circuit and a method of reading signature information that is stored in a semiconductor device.

2. Description of the Related Art

Manufacturing information of a semiconductor memory device typically includes mask information, fuse information, wafer processing information, package assembling and test information, and the like. The manufacturing information is traditionally written into a semiconductor chip using a fuse program circuit. The fuse program circuit is commonly referred to as a signature fuse circuit, and the signature fuse circuit is used for programming the lot number, die information such as a location on a wafer, and so on, so that this information can be used at a later time, for example to track a source of a defect.

Three methods are typically used to read the manufacturing information contained in the semiconductor memory devices.

A first method includes naked eye analysis of whether the signature fuse has been blown by decapping the semiconductor chip. The first method has a disadvantage that high costs are required for decapping the chip.

A second method includes measuring a current flowing through an input pin of the device to read the signature fuse data in an analog manner. According to the second method, the current is measured by allowing a current to flow through the signature fuse circuit in response to a test mode signal PSIGTEST, and the measured current is compared with a reference current as illustrated in FIG. 1. A problem of the second method is that it takes a long time to test, errors may occur in a variable test environment, and it is difficult to analyze the data using a low power voltage.

A third method includes digitally reading the signature fuse data by operating in a test mode. The third method is further divided into two approaches, that is, a register-read approach and a normal read approach.

In a register operation device such as Rambus dynamic random-access memory (RDRAM), the register-read method may include reading a register by adding only a signature fuse. However, when a semiconductor device is not a register operation device, an additional logic circuit is needed, so chip size and device layout area may be increased.

The normal read method includes adding a separate logic circuit as illustrated in FIG. 2. According to the normal read method, cell data IO and IOB are prevented from being read in the test mode, signature information SIG_IO and SIG_IOB are read through a cell data output path in the test mode. A problem of the normal read method is that an operating speed may be reduced due to the logic circuit that is added to load the signature information on the cell data output path, and the logic circuit that is needed for reading only the signature information can increase the overall size of the system.

In Korean Patent Publication Nos. 2004-68720 and 2004-69824, methods for digitally reading signature fuse data are disclosed.

SUMMARY OF THE INVENTION

Accordingly, the present invention is provided to substantially obviate one or more of the problems associated with the limitations and disadvantages of the related art.

Some embodiments of the present invention provide a signature circuit and a method of reading signature information during operation in a test mode by using an additional transistor that is directly coupled to a pad.

Some embodiments of the present invention provide a semiconductor chip having a signature circuit that is capable of reading signature information during operation in a test mode by using an additional transistor that is directly coupled to a pad.

In one aspect, the present invention is directed to a signature data circuit in a semiconductor device, comprising: a signature program circuit configured to be programmed with signature information and to output a signature signal in response to the signature information; a signature output circuit configured to block the signature signal output by the signature program circuit during operation in a normal mode, and configured to pass the signature signal during operation in a test mode; and a pad-driving transistor directly coupled to the pad, configured to drive the pad during operation in the normal mode in response to an operation command, and configured to drive the pad during operation in the test mode in response to the signature signal output by the signature output circuit.

In one embodiment, the pad-driving transistor is one of a pull-down transistor and a pull-up transistor for adjusting impedance between the pad and a power line.

In another embodiment, the pad-driving transistor is one of pull-down and pull-up transistors that are included in an on-die termination (ODT) circuit.

In another embodiment, the pad-driving transistor is one of pull-down and pull-up transistors that are included in an off-chip driver (OCD) circuit.

In another aspect, the present invention is directed to a semiconductor device programmable with signature information, comprising: a plurality of pads; at least one transistor, each transistor being coupled between a corresponding pad and a power line to adjust impedance between the corresponding pad and the power line; a signature circuit configured to be programmed with signature information and to output a signature signal in response to the signature information; and a control circuit configured to output each bit value of the signature signal to a corresponding pad through the at least one transistor coupled to the corresponding pad during operation in a test mode, and configured to prevent the each bit value of the signature signal from being output through the at least one transistor to provide an impedance control signal at the corresponding pad during operation in a normal mode.

In one embodiment, the impedance control signal is a control signal of a switching transistor for an on-die termination (ODT) circuit.

In another embodiment, the impedance control signal is a control signal of an impedance-adjusting transistor of an off-chip driver (OCD) circuit.

In another aspect, the present invention is directed to a method of reading signature information from a semiconductor device including a transistor for adjusting impedance applied to at least one device pad, comprising: setting a semiconductor device into a test mode; coupling a signature circuit to the transistor for adjusting impedance in response to activation of the test mode, the transistor being coupled to the at least one pad; and transmitting a signature information to the at least one device pad through the transistor for adjusting impedance during operation in the test mode, the signature information being programmed in the signature circuit.

In one embodiment, the signature information comprises a number of bits that is twice a number of the at least one pads so that the signature information is transmitted to the at least one pads during two cycles of the test operation.

In another embodiment, the signature information comprises a number of bits that is equal to a number of the at least one pads so that the signature information is transmitted to the at least one pads during one cycle of the test operation.

In another embodiment, the transistor for adjusting impedance is one of a switching transistor for an on-die termination (ODT) circuit and an impedance-adjusting transistor of an off-chip driver (OCD) circuit.

In this manner, by utilizing the pull-up and pull-down transistors that are used for adjusting impedance applied to a pad of the device to read the signature information, the size of the signature circuit is thereby reduced. Also, by reading multiple bits of the signature information in parallel from multiple pads of the device, the test time of the device can thereby be reduced.

BRIEF DESCRIPTION OF THE DRAWINGS

Example embodiments of the present invention will become more apparent by describing in detail example embodiments of the present invention with reference to the accompanying drawings, in which.

DETAILED DESCRIPTION OF EMBODIMENTS OF THE INVENTION

Figure 1:
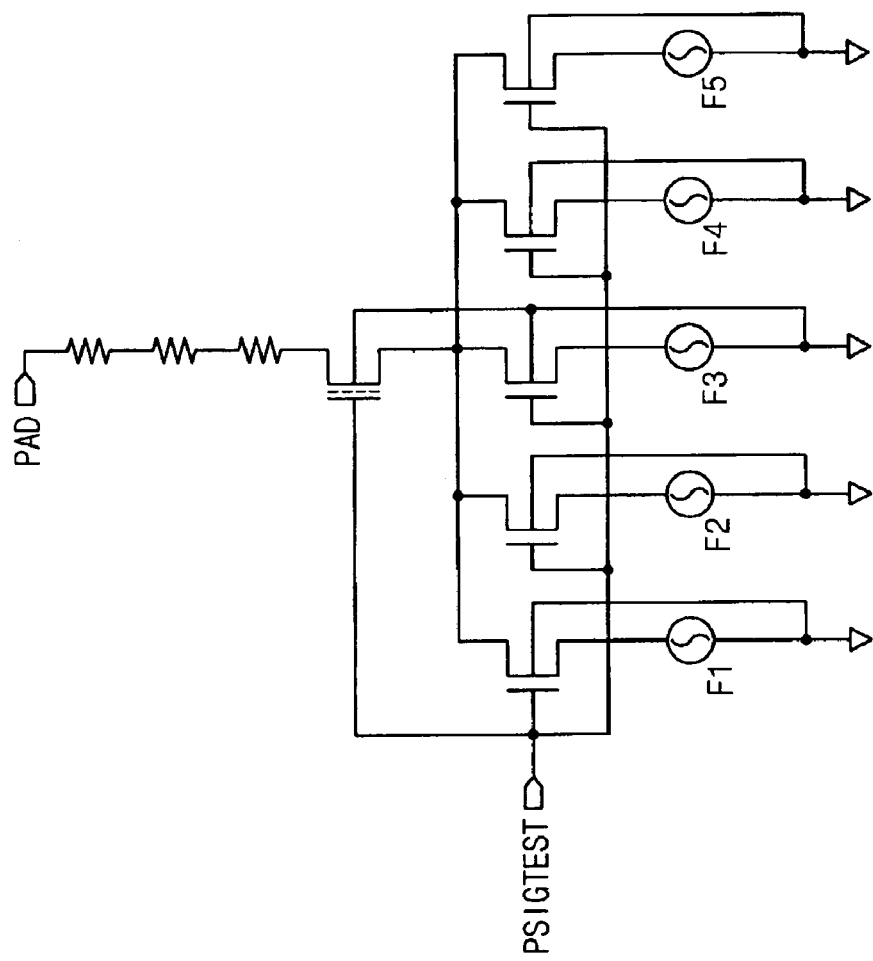
FIG. 1 is a circuit diagram illustrating a conventional signature circuit for reading signature fuse data according to current flow through a signature fuse circuit in conventional semiconductor devices.
Figure 2:
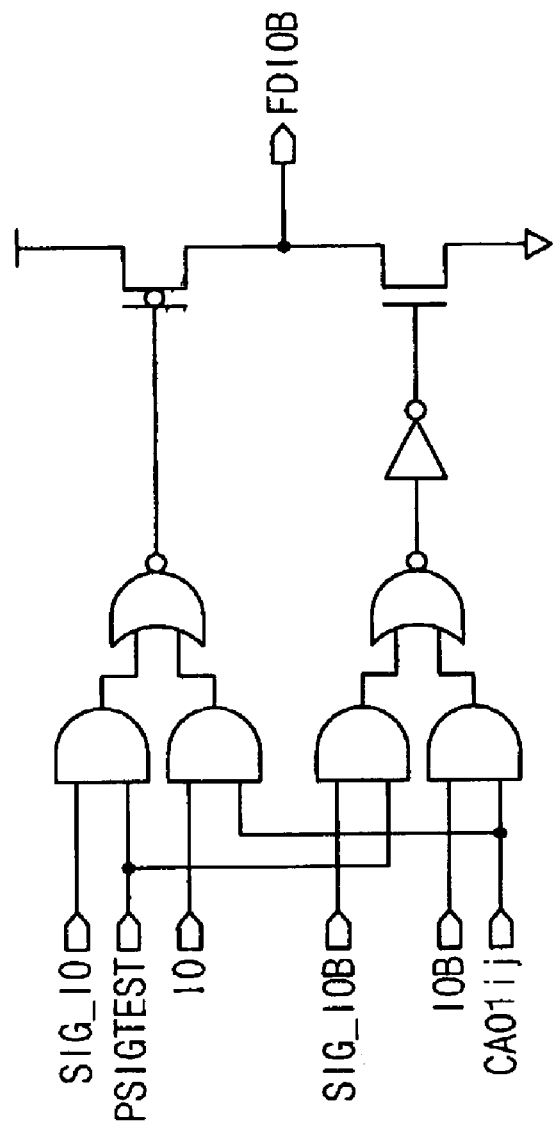
FIG. 2 is a circuit diagram illustrating a conventional output buffer to which a circuit for reading signature information is added according to a conventional approach.

Detailed illustrative example embodiments of the present invention are disclosed herein. However, specific structural and functional details disclosed herein are merely representative for purposes of describing example embodiments of the present invention. This invention may, however, be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention now will be described more fully hereinafter with reference to the accompanying figures, in which embodiments of the invention are shown.

Figure 3:
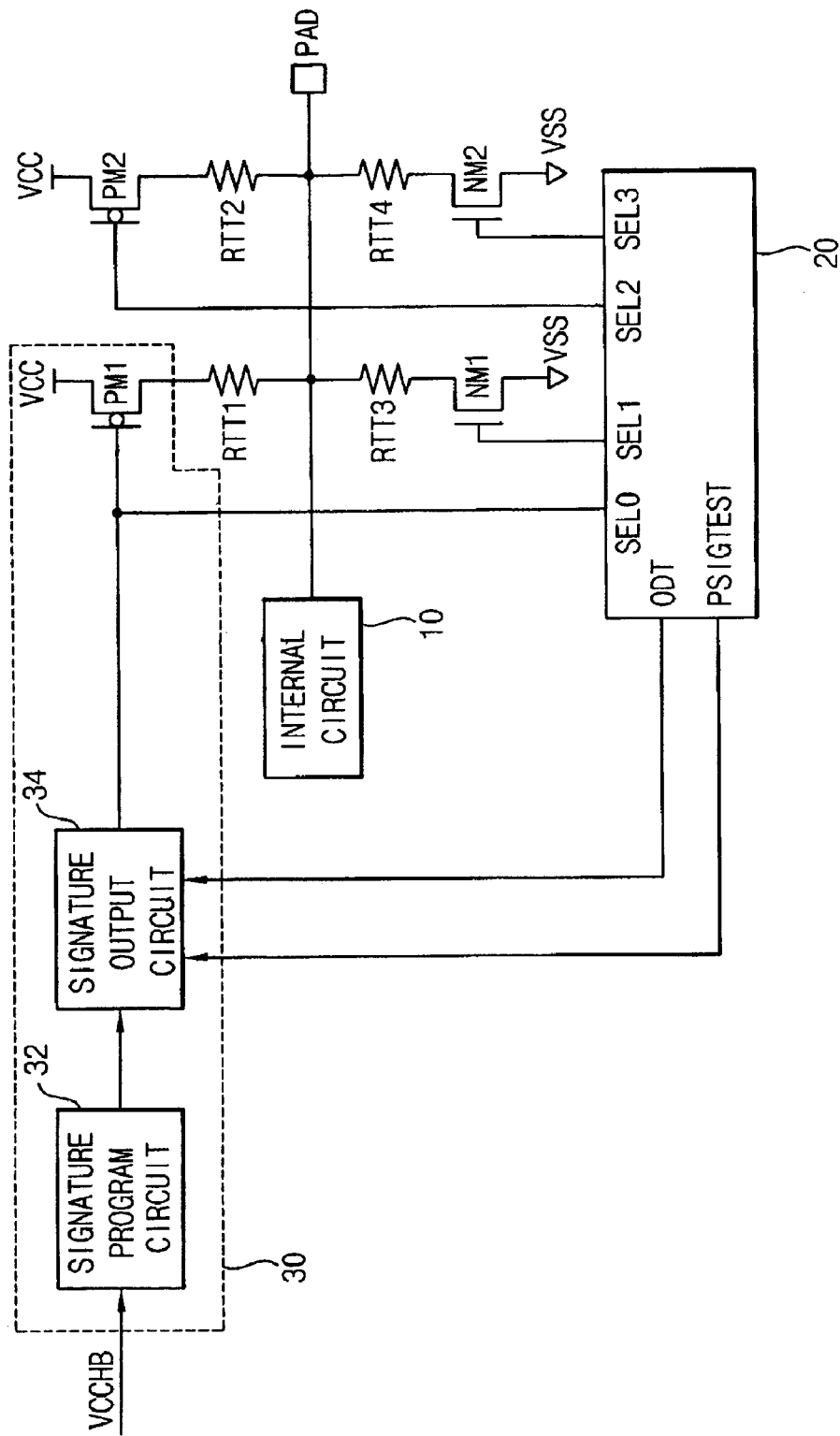
FIG. 3 is a block diagram illustrating a transistor-type signature data circuit for adjusting impedance according to an example embodiment of the present invention.

FIG. 3 is a block diagram illustrating a transistor-type signature data circuit for adjusting impedance according to an example embodiment of the present invention.

Referring to FIG. 3, the transistor-type signature data circuit for adjusting impedance is an example circuit that uses an on-die termination (ODT) switching transistor as a transistor that is coupled to a pad.

In a double data rate two (DDR2) dynamic random-access memory (DRAM), an ODT is adopted for improving confidentiality of a data signal communicated with a system. The ODT includes a terminal resistor for terminating the data bus within a memory chip and the ODT is coupled to the data bus out of necessity. That is, the terminal resistor in a standby module is coupled to the data bus when a neighbor module is in an active operation mode.

In a semiconductor chip device, data is written into or read from an internal circuit 10 through a pad PAD. A plurality of PMOS transistors and resistors coupled in series respectively such as a transistor PM1 and a resistor RTT1, and a transistor PM2 and a resistor RTT2, are coupled between the pad PAD and a power voltage VCC. Furthermore, a plurality of NMOS transistors and resistors coupled in series respectively such as a transistor NM1 and a resistor RTT3, and a transistor NM2 and a resistor RTT4, are coupled between the pad PAD and a ground voltage VSS.

The PMOS transistors PM1 and PM2 and the NMOS transistors NM1 and NM2 are activated by selection signals SEL0, SEL1 SEL2 and SEL3, respectively, which are provided from a control circuit 20. Therefore, a resistance value of a terminal resistor between the pad PAD and one of the power voltage VCC and the ground voltage VSS is determined by the transistors PM1, PM2, NM1 and NM2 that are turned on in response to the selection signals SEL0, SEL1 SEL2 and SE3.

The signature circuit 30 includes a signature program circuit 32 and a signature output circuit 34.

Signature information is programmed into the signature program circuit 32 through a fusing operation. The signature program circuit 32 is initialized in response to a signal VCCHB and then latches programmed signature information.

The signature output circuit 34 is coupled to a gate of the PMOS transistor PM1. The signature output circuit 34 receives signals ODT and PSIGTEST. In response to the received signals ODT and PSIGTEST, the signature output circuit 34 blocks the signature information during an ODT operation and outputs the signature information during a test mode.

Figure 4:
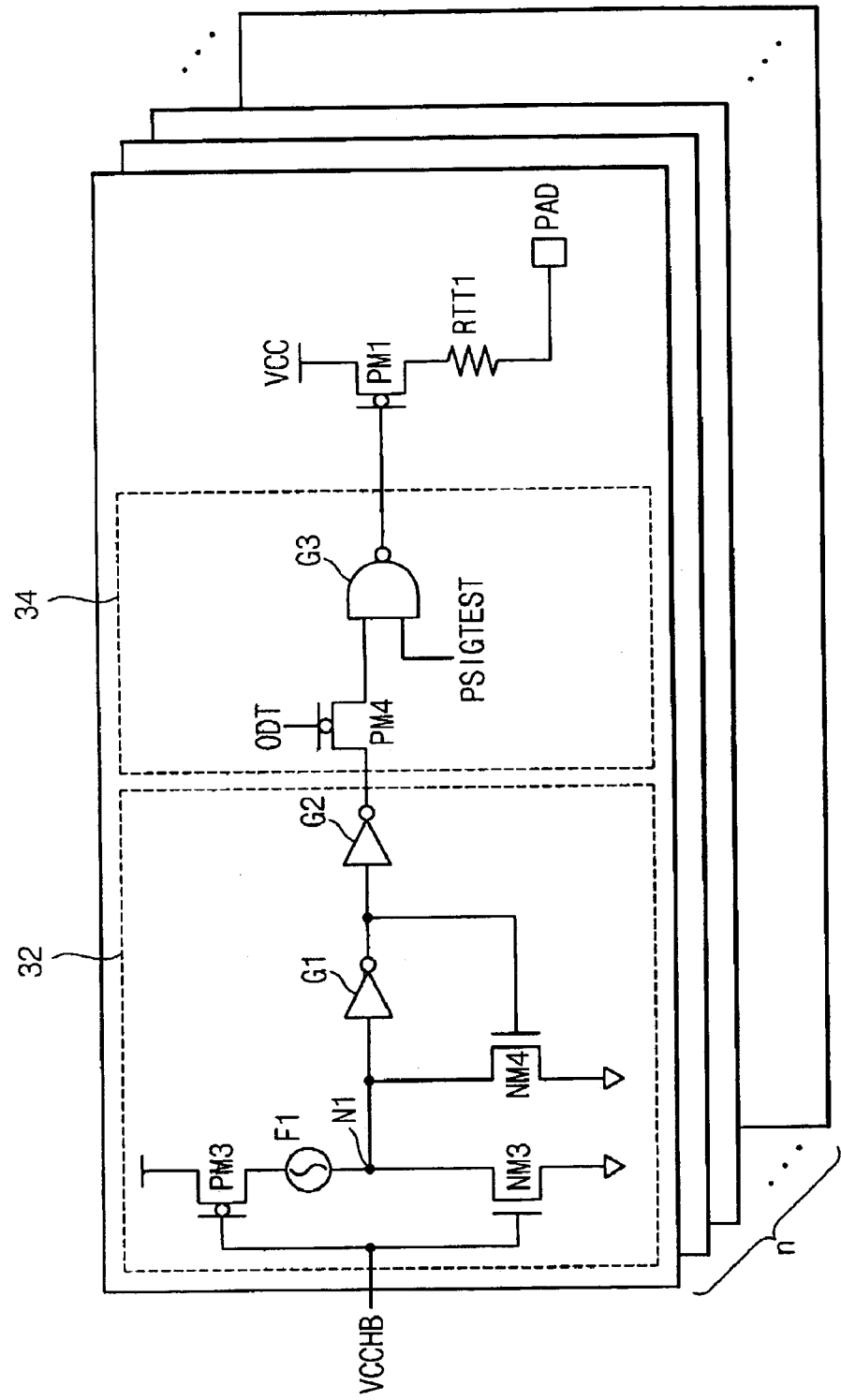
FIG. 4 is a detailed circuit diagram of the signature data circuit of FIG. 3, in accordance with the present invention.

FIG. 4 is a detailed circuit diagram of the detailed signature circuit of FIG. 3.

In the example of embodiment of FIG. 4, one bit of the signature signal is assigned to one pad. In this case, the signature information of 64 bits may be read during one cycle through 64 pads.

Referring to FIG. 4, the signature program circuit 32 includes a PMOS transistor PM3, a fuse F1, NMOS transistors NM3 and NM4, and inverters G1 and G2.

In a first operation, the fuse F1 is assumed to have not been cut. Signal VCCHB is at a high state while a power is initially supplied. In this case, the NMOS transistor NM3 is turned on, a node N1 is at a low state, and a high state is latched by the inverter G1 and the NMOS transistor NM4. Accordingly, the output signal of the inverter G2 is in a low state. When the VCCHB signal is stabilized to a low state, the NMOS transistor NM3 is turned off, and the node N1 is charged to a high state through the turned-on PMOS transistor PM3. Therefore, a low state is latched by the inverter G1 and the NMOS transistor NM4, and the output signal of the inverter G2 becomes a high state.

In a second operation, the fuse F1 is assumed to be cut. The signal VCCHB is at a high state when power is initially supplied. In this case, the NMOS transistor NM3 is turned on, the node N1 is in a low state, and a high state is latched by the inverter G1 and the NMOS transistor NM4. Accordingly, the output signal of the inverter G2 is in a low state. Although the VCCHB becomes stabilized to a low state and the NMOS transistor NM3 is turned off, the latched signal is maintained since the fuse F1 has been cut. Therefore, the output signal from the inverter G2 is in a low state.

As described above, one bit of the signature information is programmed with '0' or '1', in response to the state of the fuse.

The signature output circuit 34 includes a PMOS transistor PM4 and a NAND gate G3. A signal ODT from a control circuit 20 is applied to the PMOS transistor PM4. The signal ODT is in a high state in an ODT operation mode, and is in a low state in the other operation modes. Therefore, the PMOS transistor PM4 is always turned off in the ODT operation mode, thereby preventing the signature information from being output.

The NAND gate G3 applies the signature signal that is output through the PMOS transistor PM4, to a gate of the PMOS transistor PM1 in response to a signal PSIGTEST An active state of the signal PSIGTEST corresponds to a logic 'high' state and an inactive state corresponds to a logic 'low' state. Therefore, only when the signal PSIGTEST is in a high state, the inverter G3 applies the signature information to the gate of the PMOS transistor PM1. When the signal PSIGTEST is in a low state, the signature information is blocked.

When the signal PSIGTEST is in a high state and the signature signal is also in a high state, a low state signal is applied to the gate of the PMOS transistor PM1, and a high state signal is output through the pad PAD. On the contrary, when the signal PSIGTEST is in a high state and the signature information is in a low state, the pad PAD is in a high-impedance state since a high state signal is applied to the gate of the PMOS transistor PM1. Therefore, the signature output circuit 34 outputs the signature information only during operation in a test mode and blocks the signature information during operation in an ODT operation mode.

Figure 5:
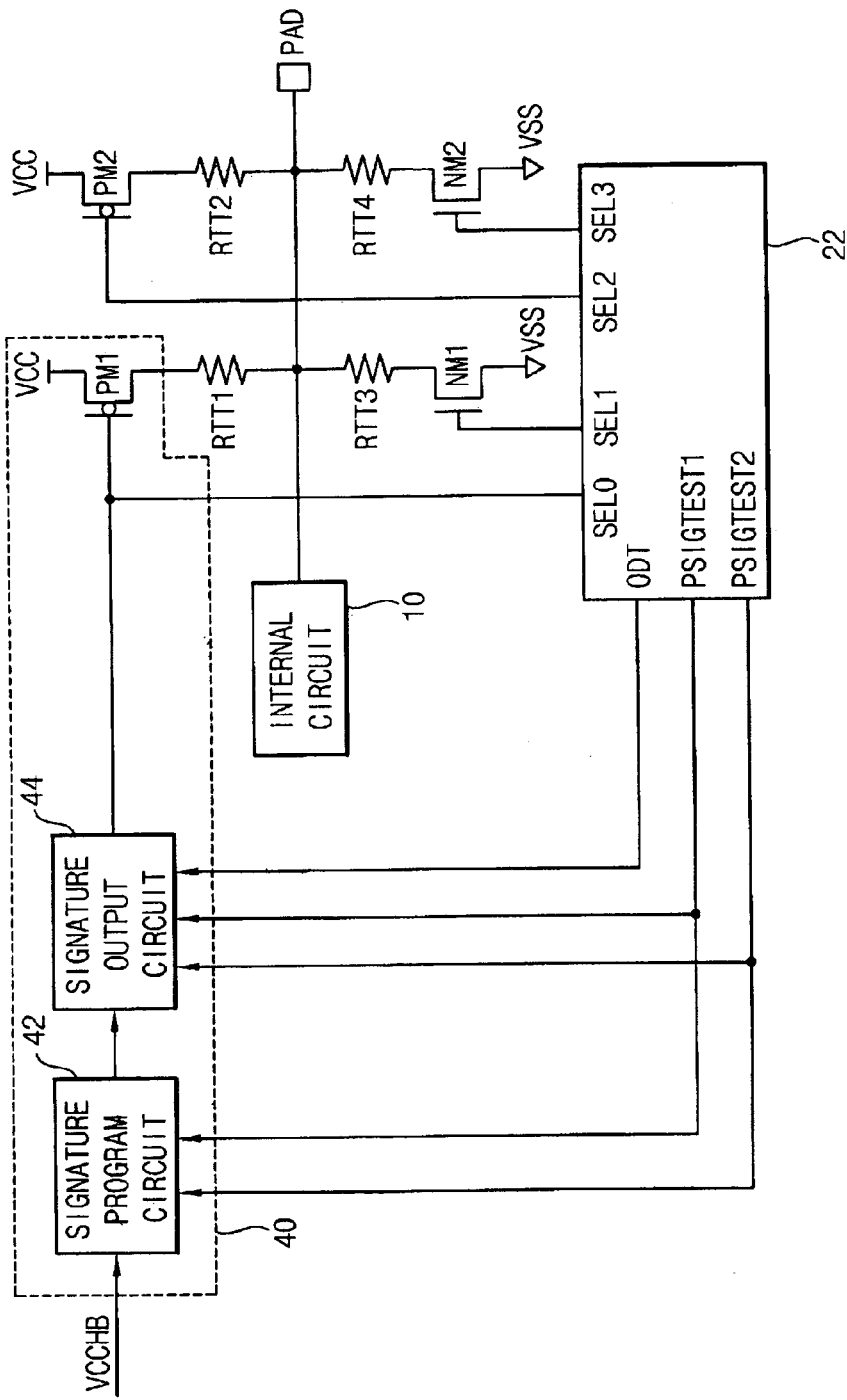
FIG. 5 is a block diagram illustrating a transistor-type signature data circuit for adjusting impedance according to another example embodiment of the present invention.
Figure 6:
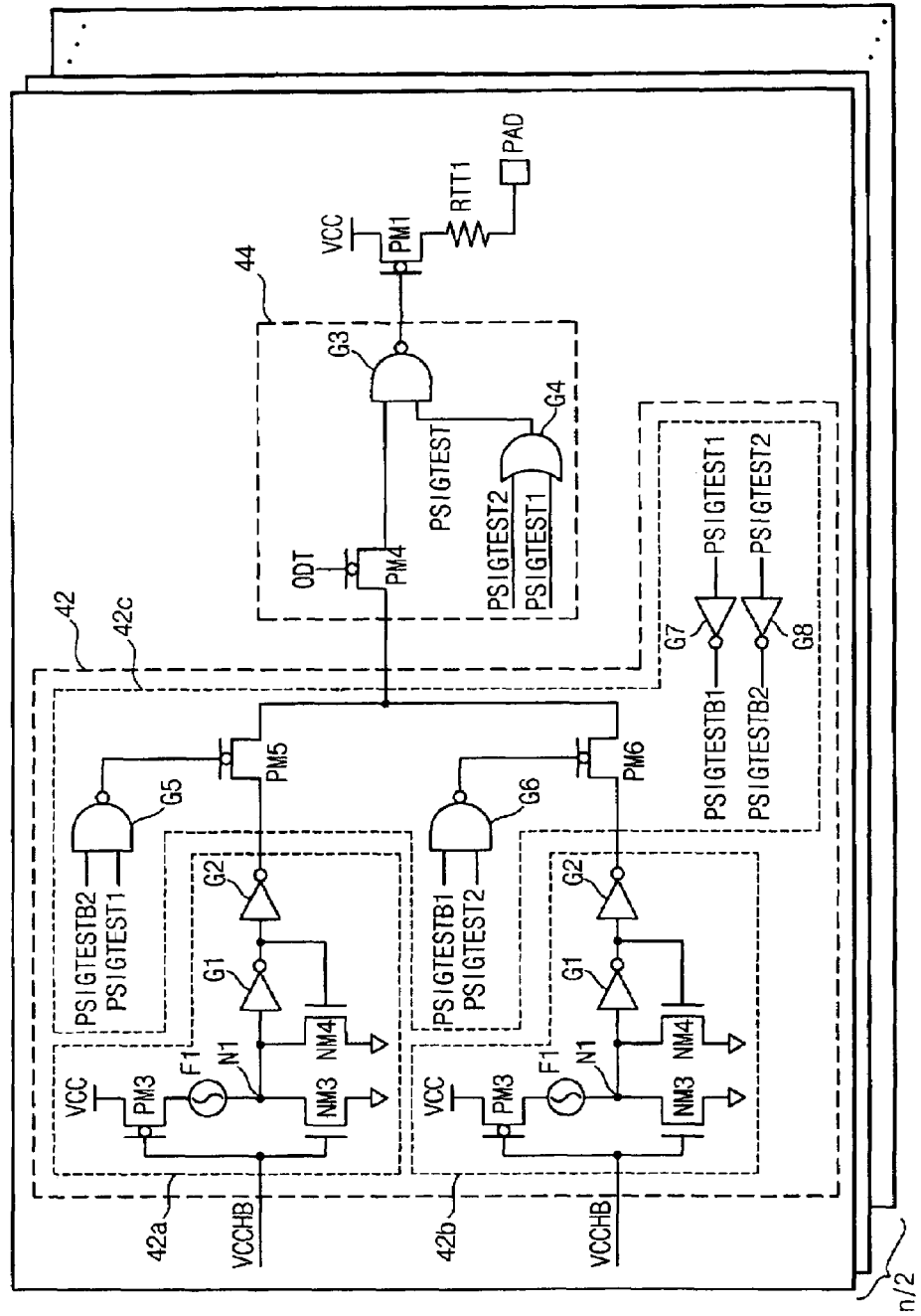
FIG. 6 is a detailed circuit diagram of the signature data circuit of FIG. 5, in accordance with the present invention.

FIG. 5 is a block diagram illustrating a transistor-type signature data circuit for adjusting impedance according to another example embodiment of the present invention, and FIG. 6 is a detailed circuit diagram of the signature data circuit of FIG. 5.

In the transistor-type signature circuit of FIGS. 5 and 6, a two-bit signature signal is assigned to one pad. Therefore, for example, the signature information of 64 bits may be read in two cycles through 32 pads.

Referring to FIG. 5, a signature circuit 40 receives first and second signature test signals PSIGTEST1 and PSIGTEST2 from a control circuit 22. The second signature test signal PSIGTEST2 has a phase delayed by as much as the active pulse width with respect to the first signature test signal PSIGTEST1. Therefore, after the first signature test signal PSIGTEST1 is activated, the second signature test signal SIGTEST2 is activated.

Referring to FIG. 6, the signature circuit 40 includes a signature program circuit 42 and a signature output circuit 44.

A two-bit signature signal including an upper bit (UB) and a lower bit (LB), is programmed in the signature program circuit 42. The signature program circuit 42 includes a UB program circuit 42A, an LB program circuit 42B and a multiplexing circuit 42C. Since the UB program circuit 42A and the LB program circuit 42B have configurations similar to that of the signature program circuit 32 described above, detailed descriptions are omitted in the present embodiment.

The multiplexing circuit 42C multiplexes the upper bit and the lower bit. The multiplexing circuit 42C includes PMOS transistors PM5 and PM6, NAND gates G5 and G6, and inverters G7 and G8.

The inverter G7 inverts the first signature test signal PSIGTEST1 signal to generate a signal PSIGTESTB1. The inverter G8 inverts the second signature test, signal PSIGTEST2 to generate a signal PSIGTESTB2. The NAND gate G5 performs a NAND operation on the signals PSIGTEST1 and PSIGTESTB2 to switch the PMOS transistor PM5. The PMOS transistor PM5, when activated, selects the upper bit for output. The NAND gate G6 performs a NAND operation on the signals PSIGTEST2 and PSIGTESTB1 to switch the PMOS transistor PM6. The PMOS transistor PM5, when activated, selects the lower bit for output.

The signature output circuit 44 includes a PMOS transistor PM4, a NAND gate G3 and an OR gate G4. The OR gate G4 performs an OR operation on the signals PSIGTEST1 and PSIGTEST2 to generate a signal PSIGTEST. The NAND gate G3 applies a signature signal output from the PMOS transistor PM4 to a gate of a PMOS transistor PM1 in response to the signal PSIGTEST. An active state of the signal PSIGTEST corresponds to a logic 'high' state and an inactive state corresponds to a logic 'low' state. Therefore, the NAND gate G3 applies the signature information to the gate of the PMOS transistor PM1 only when the signal PSIGTEST is in a high state. On the contrary, the signature information is blocked when the signal PSIGTEST is in a low state. When the signal PSIGTEST and the signature information are in a high state, a low state signal is applied to the gate of the PMOS transistor PM1, and a high state signal is output from the pad PAD. On the contrary, when the signal PSIGTEST is in a high state and the signature information is in a low state, the pad PAD is in a high impedance state since a high state signal is applied to the gate of the PMOS transistor PM1.

Therefore, in the signature output circuit 44, the signature information is output only when operating in a test mode during which the signals PSIGTEST1 and PSIGTEST2 are in a high state. However, the signature information is blocked when operating in an ODT mode.

Therefore, 32 upper bits of the signature information may be read through 32 pads in response to the signal PSIGTEST1 and 32 lower bits of the signature information may be read through the pads in response to the signal PSIGTEST2. Therefore, 64-bit signature information can be read via 32 pads during two cycles of the test operation.

As described above, the signature circuit according to the above example embodiments of the present invention reduce chip size by omitting an additional logic circuit for the signature circuit, by forming a path for reading signature information, such as a manufacturing information of a semiconductor chip, from the semiconductor chip to a pad through a transistor that is coupled to the pad for adjusting impedance. Furthermore, reading speed may be increased so that test time may be decreased, since the signature information may be read in parallel through a plurality of pads.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A signature circuit in a semiconductor device, comprising:
   a signature program circuit configured to be programmed with signature information and to output a signature signal in response to the signature information;
   a signature output circuit configured to block the signature signal output by the signature program circuit during operation in a normal mode, and configured to pass the signature signal during operation in a test mode; and
   a pad-driving transistor directly coupled to a pad, configured to drive the pad during operation in the normal mode in response to an operation command, and configured to drive the pad during operation in the test mode in response to the signature signal output by the signature output circuit,
   wherein a gate of the pad-driving transistor is directly coupled to the signature output circuit.

2. The signature circuit of claim 1, wherein the pad-driving transistor is one of a pull-down transistor and a pull-up transistor for adjusting impedance between the pad and a power line.

3. The signature circuit of claim 2, wherein the pad-driving transistor is one of pull-down and pull-up transistors that are included in an on-die termination (ODT) circuit.

4. The signature circuit of claim 2, wherein the pad-driving transistor is one of pull-down and pull-up transistors that are included in an off-chip driver (OCD) circuit.

5. The signature circuit of claim 1, wherein the signature program circuit comprises:
   a first PMOS transistor having a first gate for receiving a first signal, a first source coupled to a first power supply voltage, and a first drain;
   a first NMOS transistor having a second gate for receiving the first signal, a second source coupled to a second power supply voltage, and a second drain coupled to a first node, the second gate coupled to the first gate;
   a fuse configured to be programmed with the signature information, the fuse having a first terminal coupled to the first node and a second terminal coupled to the first drain; and
   a latch circuit configured to latch a logic state of a voltage at the first node.

6. The signature circuit of claim 5, wherein the latch circuit comprises:
   a second NMOS transistor having a gate coupled to a second node, a source coupled to the second power supply voltage, and a drain coupled to the first node; and
   a first inverter having an input terminal coupled to the first node and an output terminal coupled to the second node.

7. The signature circuit of claim 6, wherein the signature program circuit further comprises a second inverter having an input terminal coupled to the second node and an output terminal coupled to the signature output circuit.

8. The signature circuit of claim 5, wherein the first signal is activated while a power is initially supplied.

9. The signature circuit of claim 1, wherein the signature program circuit comprises:
   a first PMOS transistor having a first gate for receiving a first signal, a first source coupled to a first power supply voltage, and a first drain;
   a first NMOS transistor having a second gate for receiving the first signal, a second source coupled to a second power supply voltage, and a second drain coupled to a first node, the second gate coupled to the first gate;
   a first fuse configured to be programmed with a first bit of the signature information, the first fuse having a first terminal coupled to the first node and a second terminal coupled to the first drain;
   a first latch circuit configured to latch a logic state of a voltage at the first node;
   a second PMOS transistor having a third gate for receiving the first signal, a third source coupled to the first power supply voltage, and a third drain;
   a second NMOS transistor having a fourth gate for receiving the first signal, a fourth source coupled to the second power supply voltage, and a fourth drain coupled to a third node, the fourth gate coupled to the third gate;
   a second fuse configured to be programmed with a second bit of the signature information, the second fuse having a third terminal coupled to the third node and a fourth terminal coupled to the third drain; and a second latch circuit configured to latch a logic state of a voltage at the third node.

10. A semiconductor device programmable with signature information, comprising:
a plurality of pads;
at least one transistor, each transistor being coupled between a corresponding pad and a power line to adjust impedance between the corresponding pad and the power line;
a signature circuit configured to be programmed with signature information and to output a signature signal in response to the signature information; and
a control circuit configured to output each bit value of the signature signal to a corresponding pad through the at least one transistor coupled to the corresponding pad during operation in a test mode, and configured to prevent the each bit value of the signature signal from being output through the at least one transistor to provide an impedance control signal at the corresponding pad during operation in a normal mode,
wherein a gate of the at least one transistor is directly coupled to the signature circuit.

11. The semiconductor chip of claim 10, wherein the impedance control signal is a control signal of a switching transistor for an on-die termination (ODT) circuit.

12. The semiconductor chip of claim 10, wherein the impedance control signal is a control signal of an impedance-adjusting transistor of an off-chip driver (OCD) circuit.

13. A method of reading signature information from a semiconductor device including a transistor for adjusting impedance applied to at least one device pad, comprising:
setting the semiconductor device into a test mode;
directly coupling a signature circuit to a gate of the transistor for adjusting impedance in response to activation of the test mode, the transistor being coupled to the at least one pad; and
transmitting a signature information to the at least one device pad through the transistor for adjusting impedance during operation in the test mode, the signature information being programmed in the signature circuit.

14. The method of claim 13, wherein the signature information comprises a number of bits that is twice a number of the at least one pad so that the signature information is transmitted to the at least one pad during two cycles of the test operation.

15. The method of claim 13, wherein the signature information comprises a number of bits that is equal to a number of the at least one pad so that the signature information is transmitted to the at least one pad during one cycle of the test operation.

16. The method of claim 13, wherein the transistor for adjusting impedance is one of a switching transistor for an on-die termination (ODT) circuit and an impedance-adjusting transistor of an off-chip driver (OCD) circuit.

* * * * *